United States Patent
Xu et al.

(10) Patent No.: US 9,786,385 B2
(45) Date of Patent: Oct. 10, 2017

(54) MEMORY POWER SELECTION USING LOCAL VOLTAGE REGULATORS

(71) Applicant: ORACLE INTERNATIONAL CORPORATION, Redwood Shores, CA (US)

(72) Inventors: Pangjie Xu, Santa Clara, CA (US); Hoyeol Cho, Redwood City, CA (US); Ioannis Orginos, Sunnyvale, CA (US)

(73) Assignee: ORACLE INTERNATIONAL CORPORATION, Redwood Shores, CA (US)

( * ) Notice: Subject to any disclaimer, the term of this patent is extended or adjusted under 35 U.S.C. 154(b) by 64 days.

(21) Appl. No.: 14/635,264

(22) Filed: Mar. 2, 2015

(65) Prior Publication Data

US 2016/0260472 A1 Sep. 8, 2016

(51) Int. Cl.
*G11C 29/50* (2006.01)
*G11C 29/12* (2006.01)
*G11C 5/14* (2006.01)
*G11C 11/417* (2006.01)

(52) U.S. Cl.
CPC ........ *G11C 29/50* (2013.01); *G11C 29/12005* (2013.01); *G11C 5/147* (2013.01); *G11C 11/417* (2013.01)

(58) Field of Classification Search
CPC . G11C 11/419; G11C 29/50; G11C 29/12005; G11C 5/147; G11C 11/417
USPC ........................................................ 365/154
See application file for complete search history.

(56) References Cited

U.S. PATENT DOCUMENTS

| 4,418,403 | A  | * | 11/1983 | O'Toole   | G11C 29/50    |
|           |    |   |         |           | 365/201       |
| 5,901,103 | A  | * | 5/1999  | Harris, II | G11C 5/141    |
|           |    |   |         |           | 365/201       |
| 8,040,717 | B2 | * | 10/2011 | Ouchi     | H01L 21/845   |
|           |    |   |         |           | 365/154       |
| 8,355,276 | B2 | * | 1/2013  | Idgunji   | G11C 11/413   |
|           |    |   |         |           | 365/154       |
| 8,848,414 | B2 | * | 9/2014  | Arsovski  | G11C 15/00    |
|           |    |   |         |           | 365/156       |
| 2006/0259840 | A1 | * | 11/2006 | Abadeer | G01R 31/3004 |
|           |    |   |         |           | 714/733       |
| 2008/0082873 | A1 | * | 4/2008 | Russell  | G11C 5/147    |
|           |    |   |         |           | 714/721       |
| 2008/0122499 | A1 | * | 5/2008 | Frew     | H02H 3/207    |
|           |    |   |         |           | 327/143       |
| 2010/0017042 | A1 | * | 1/2010 | Lopata   | G06F 1/3203   |
|           |    |   |         |           | 700/286       |
| 2010/0238751 | A1 | * | 9/2010 | Dell     | G11C 5/063    |
|           |    |   |         |           | 365/226       |

(Continued)

*Primary Examiner* — Viet Q Nguyen
(74) *Attorney, Agent, or Firm* — Cooper Legal Group, LLC

(57) ABSTRACT

Systems, methods, and other embodiments associated with using a local voltage regulator embedded within a memory sub-array are described. In one embodiment, a memory device includes a memory sub-array including a set of memory cells and a local voltage regulator. The local voltage regulator is configured to generate a local voltage for powering the memory sub-array. The memory device includes switch logic connected to the memory sub-array and configured to select between the local voltage and a source voltage to power the memory sub-array. The source voltage is provided to the memory device by a host device.

17 Claims, 4 Drawing Sheets

(56) References Cited

U.S. PATENT DOCUMENTS

| | | | |
|---|---|---|---|
| 2010/0277990 A1* | 11/2010 | Kenkare | G11C 5/147 365/189.011 |
| 2010/0329063 A1* | 12/2010 | Cho | G11C 11/413 365/226 |
| 2013/0021864 A1* | 1/2013 | Deng | G11C 29/50 365/201 |
| 2013/0039139 A1* | 2/2013 | Raval | G11C 29/06 365/201 |
| 2013/0135953 A1* | 5/2013 | Hirabayashi | G11C 29/50016 365/201 |
| 2013/0141962 A1* | 6/2013 | Liaw | G11C 11/412 365/154 |
| 2013/0163357 A1* | 6/2013 | Buer | G11C 8/08 365/201 |
| 2013/0170312 A1* | 7/2013 | Tiyyagura | G01R 31/40 365/229 |

* cited by examiner

MEMORY POWER SELECTION USING LOCAL VOLTAGE REGULATORS

BACKGROUND

Weak memory cells are memory cells that malfunction when operating at a lower voltage than a primary source voltage. In general, the malfunctioning manifests as an error when a bit value is incorrectly written to or read from the weak memory cell. The memory cells are "weak" in comparison to other memory cells that function properly at the same low voltage. In general, defects in the weak cells caused by process variations lead to malfunctions when a source voltage is lowered. Consequently, the presence of weak memory cells causes difficulties when operating in various modes (e.g., power saving modes) that use lower voltages.

Additionally, identifying which memory cells are weak cells can be a difficult task. For example, testing a memory for weak memory cells may include executing test data through the memory cells while lowering a voltage of the memory. However, because lowering the voltage also lowers a voltage of built-in testing components, the testing components may fail prior to detecting the weak cells. Furthermore, write and read errors merge together in output from memory cells because the operations occur in series prior to availability of an output. Thus, identifying weak memory cells and which operation is responsible for an error is difficult.

BRIEF DESCRIPTION OF THE DRAWINGS

The accompanying drawings, which are incorporated in and constitute a part of the specification, illustrate various systems, methods, and other embodiments of the disclosure. It will be appreciated that the illustrated element boundaries (e.g., boxes, groups of boxes, or other shapes) in the figures represent one embodiment of the boundaries. In some embodiments, one element may be implemented as multiple elements or that multiple elements may be implemented as one element. In some embodiments, an element shown as an internal component of another element may be implemented as an external component and vice versa. Furthermore, elements may not be drawn to scale.

DETAILED DESCRIPTION

Systems, methods and other embodiments are described herein associated with using individual local voltage regulators within memory sub-arrays of a memory device. In one embodiment, a voltage for powering a memory sub-array is selectively switched between a local voltage generated by a local voltage regulator and a source voltage provided by, for example, a host device. In general, having both a local voltage and a primary source voltage, instead of only the primary source voltage, permits more precisely controlling a voltage provided to the memory device.

For example, the local voltage regulators provide a local voltage within a sub-array. The local regulator provides the local voltage in addition to a source voltage that is already available. Accordingly, a switch that connects the sub-array with the two voltages permits dynamically selecting between the source voltage and the local voltage. Thus, a time when a particular voltage is supplied to a memory sub-array can be controlled, thereby allowing isolation of different memory operations and avoiding varying the source voltage. Consequently, various aspects of memory cells can be tested while maintaining a constant voltage to other components outside of the memory sub-arrays (e.g., a memory built-in self test (MBIST) component).

For example, the local voltage regulator is controlled to provide different voltage levels than a primary source voltage (e.g., Vdd). Thus, a power source to a memory sub-array can be switched between the selected local voltage and the source voltage on-the-fly. Providing the ability to control a voltage level and when the particular voltage is applied to the memory sub-array permits, for example, isolating particular memory operations for testing at lower voltages and thus components related to those particular memory operations.

Figure 1:
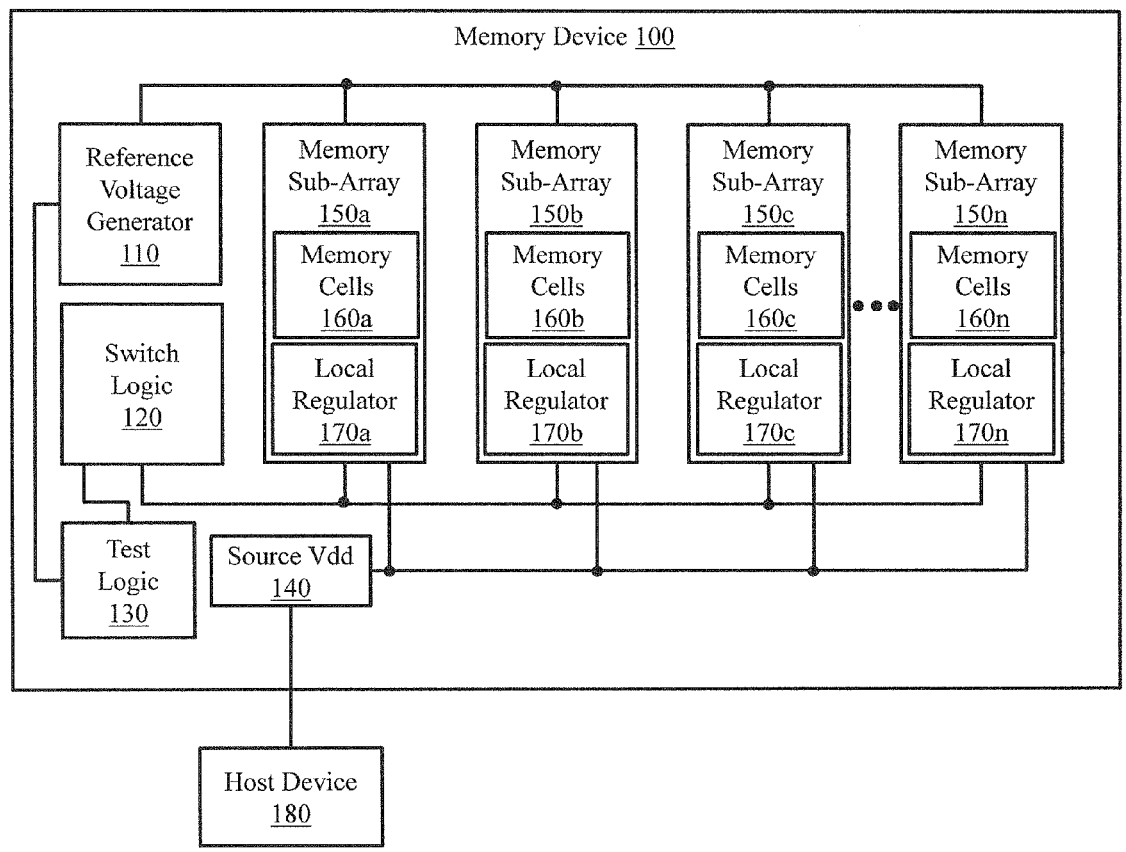
FIG. 1 illustrates one embodiment of a memory device associated with using local regulators.

With reference to FIG. 1, one embodiment of a memory device 100 associated with using local voltage regulators within each memory sub-array is illustrated. In one embodiment, the memory device 100 includes a reference voltage generator 110, switch logic 120, test logic 130, a primary source Vdd 140 (also referred to throughout this disclosure as a source voltage), and memory sub-arrays 150a, 150b, 150c through 150n. While four separate memory sub-arrays are illustrated, of course, a number of memory sub-arrays may vary depending on a particular implementation.

In general, each of the memory sub-arrays 150a-n have a similar structure. For example, the memory sub-array 150a includes memory cells 160a and a local voltage regulator 170a. Similarly, the memory sub-arrays 150b-n include memory cells 160b-n and voltage regulators 170b-n. The memory cells 160a-n are, for example, static random access memory (SRAM) cells. In one embodiment, the SRAM cells are fin-based field effect transistors (FinFETs), metal oxide semiconductor FETs (MOSFETS) and so on.

In general, each of the memory sub-arrays 150a-n is provided with an individual voltage regulator (e.g., local regulators 170a-n) so that a voltage level produced within each of the particular memory sub-array 150a-n can be controlled independently of the source voltage Vdd 140. That is, the memory sub-arrays 150a-n have two separate voltage supplies. At any given time, one of the two voltage supplies are selected to power the memory sub-arrays 150a-n.

The source voltage Vdd 140 is a voltage that is provided by a host device 180 to the memory device 100. In one embodiment, the host device 180 is a hardware processor, system on-a-chip (SoC) or another device. Thus, the memory device is an embedded cache memory the host device 180. For example, the memory device 100 may be an L3 cache of the hardware processor. In either case, the source voltage Vdd 140 is provided to the memory device 100 by a host device 180 such as the hardware processor and thus is controlled by the host device.

By contrast a local voltage is supplied by a local voltage regulator (e.g., regulators 170a-n) to a respective memory sub-array 150a-n within which the regulator is embedded. The local regulators 170a-n will be discussed in more detail with respect to FIGS. 2 through 4, however, it should be understood that the local regulators 170a-n are connected to and controlled by the reference voltage generator 110.

In one embodiment, the reference voltage generator 110 is a bandgap voltage reference circuit that provides a reference voltage to the local regulators 170a-n. The reference voltage is used to control a voltage produced by the local regulators 170a-n. Providing the reference voltage to the local regulators 170a-n permits the reference voltage generator 110 to control a voltage level generated by the local regulators 170a-n. That is, the reference voltage generator 110 is configured to change the reference voltage to control the local voltage regulators 170a-n to provide selected different voltages to the memory sub-arrays 150a-n.

Consequently, in one embodiment, a voltage level of the reference voltage is controlled to cause the local regulators 170a-n to provide selected local voltages. For example, a value of a reference register associated with the reference voltage generator 110 is modified by the test logic 130 or another component in order to control the value of the reference voltage and thereby also control a voltage level produced by the local regulators 170a-n. Thus, in one embodiment, the test logic 130 controls the voltage generator 110 to produce a specific value for Vref. In this way, a voltage level produced by the local regulators 170a-n can be dynamically controlled over time to vary between particular selected voltages.

Accordingly, the local regulators 170a-n can produce different voltage values to power the memory sub-arrays 150a-n. As a result, a finer granularity of control is available in regards to what voltage is used to power the memory sub-arrays 170a-n at a given time while not modifying the source voltage Vdd 140 supplied to other components (e.g., MBIST included with the test logic 130) of the memory device 100.

Additionally, not only can a value of the local voltage be precisely controlled via the local regulators 170a-n, but a time when the local voltage is used to power the memory sub-arrays 150a-n is also controlled via the switch logic 120. In one embodiment, the switch logic 120 controls a switch in each memory sub-array 150a-n to select between the source voltage Vdd 140 provided via a power rail or a local voltage provided by the local regulators 170a-n. Thus, in addition to controlling a specific voltage level of the local voltage, a time when the local voltage is switched on to power the memory sub-arrays 150a-n is also controlled.

That is, the switch logic 120 is configured to precisely control when the source voltage or the local voltage power the memory sub-arrays 150a-n. In one embodiment, the test logic 130 controls the switch logic 120 to switch power in a particular sub-array between the source Vdd and a local voltage depending on a memory operation being tested (e.g., write, retention, read). By precisely controlling a voltage provided to the memory sub-arrays 150a-n at different times during operation of the memory cells 160a-n, different portions of the memory cells 160a-n can be isolated for testing, to save power, and so on.

Furthermore, while the switch logic 120 is generally discussed as controlling the memory sub-arrays 150a-n together, of course, the switch logic 120 may independently control a switch in each of the memory sub-arrays 150a-n. That is, the switch logic 120 selects between the local voltage and the source voltage Vdd 140 independently and dynamically for each of the memory sub-arrays 150a-n. While a single connection is illustrated between the switch logic 120 and the memory sub-arrays 150a-n, it should be appreciated that the single line may include as many signal lines as necessary to independently control switches in each sub-array.

Additionally, in one embodiment, the test logic 130 controls the switch logic 120 to select between voltages. For example, the test logic 130 may control the switch logic 120 to select a low voltage from the local regulators 170a when testing the memory cells 160a for weak read bit cells. Thus, during a write operation and while the memory cells are retaining the written data, the switch logic 120 selects the source voltage Vdd 140, which is the primary source voltage. Additionally, the test logic 130 may also control the reference voltage so that the local regulators 170a-n generate specific selected local voltages that are lower than source voltage Vdd 140.

Thus, during the test read operation, the switch logic 120 controls a switch to select the local voltage instead of the source voltage Vdd 140. Accordingly, the read operation and associated components are thereby isolated for low voltage testing, which can reveal the presence of weak components. Write operations and memory cell retention may be tested in a similar manner. Further aspects of using the local regulators 170a-n to selectively supply the memory sub-arrays 150a-n with voltage levels different from the source voltage (Vdd 140) will be discussed in relation to FIG. 4.

Figure 2:
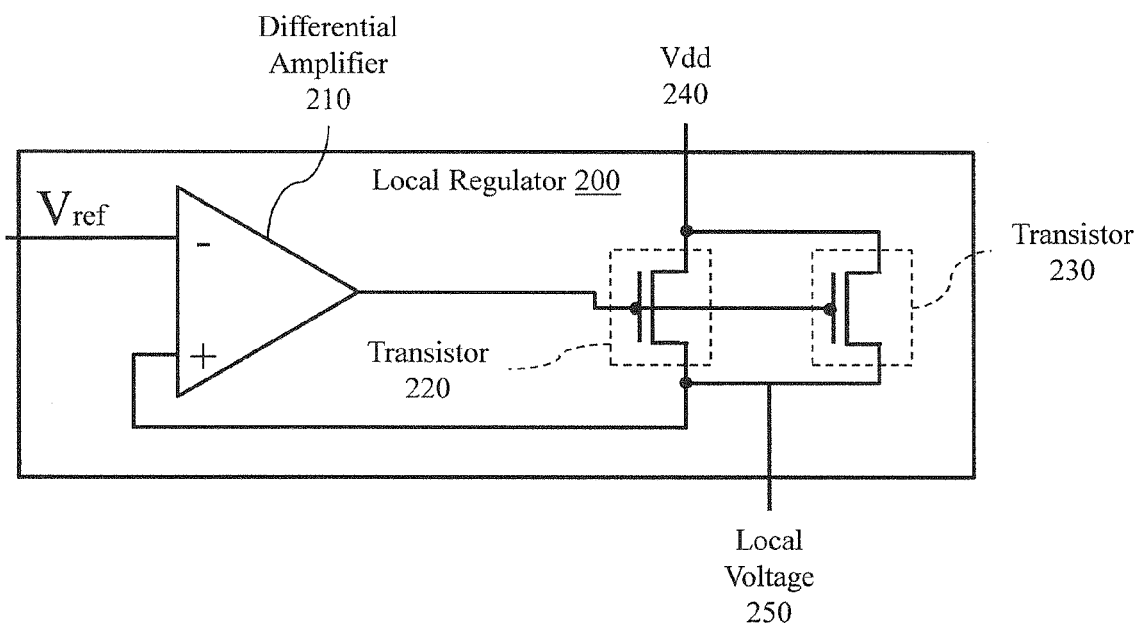
FIG. 2 illustrates one embodiment of a local regulator.

Various aspects of the configuration for the local voltage regulators 170a-n will be discussed in relation to FIGS. 2 and 3. FIG. 2 illustrates one embodiment of a local regulator 200 that is similar to the local regulators 170a-n of FIG. 1. The local regulator 200 includes a differential amplifier 210. In one embodiment, the differential amplifier 210 is a low dropout regulator, an operational amplifier or a similar device. In either case, the differential amplifier 210 receives as an input a reference voltage (Vref) from, for example, the reference voltage generator 110 of FIG. 1.

An output of the differential amplifier 210 is connected to a gate of a first transistor 220 and a gate of a second transistor 230. The transistors 220 and 230 are illustrated as p-type MOSFETs (pmos). However, depending on particular implementation details the transistors 220 and 230 may be pmos, n-type MOSFETs (nmos), FinFETs or similar devices. Sources of the first transistor 220 and the second transistor 230 are connected to a source voltage Vdd 240. Drains of the transistors 220 and 230 are connected back to an input of the differential amplifier 210 and also to a lead that provides a local voltage 250 to a memory sub-array (e.g., memory sub-array 150a). In general, the local voltage 250 produced by the local regulator 200 is a function of the reference voltage Vref. Thus, as the reference voltage Vref is varied the local voltage 250 changes as a function of the reference voltage Vref.

Figure 3:
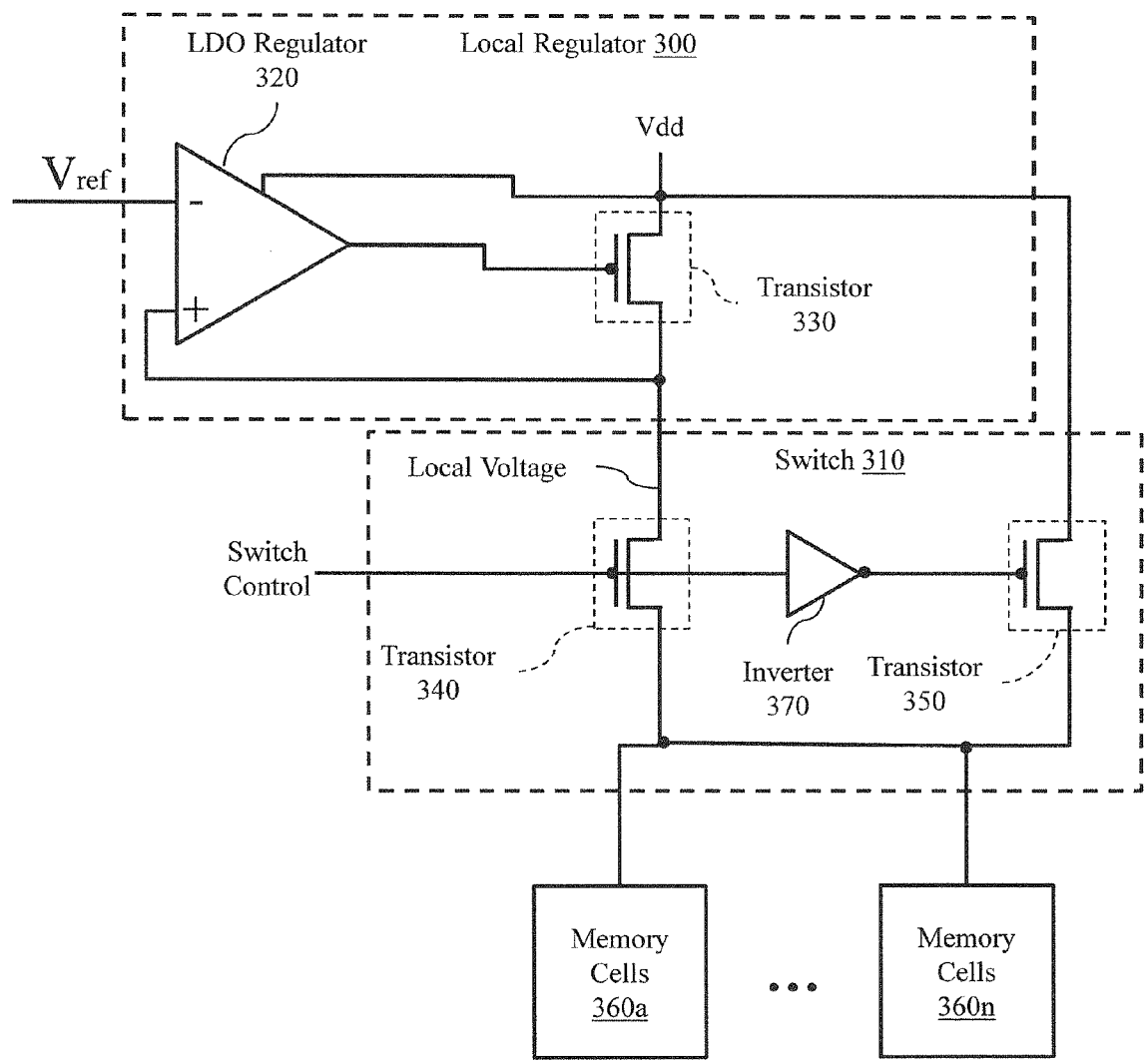
FIG. 3 illustrates one embodiment of a local regulator and a switch for selecting between different voltages.

FIG. 3 illustrates another embodiment of a local regulator 300 and a switch 310. The local regulator 300 includes a low-dropout regulator 320 and a transistor 330. A reference voltage (Vref) provided by, for example, the reference voltage generator 110 of FIG. 1 is connected to an input of the LDO regulator 320. An output of the LDO regulator 320 is connected to a gate of the transistor 330. A source of the transistor 330 is connected to a source voltage (Vdd), while a drain of the transistor 330 is connected to a second input of the LDO regulator and also provides a local voltage to a first transistor 340 of the switch 310.

A second transistor 350 of the switch 310 is connected to the source voltage (Vdd) and provides the source voltage (Vdd) to the memory cells 360a-n when activated. The first transistor 340 provides the local voltage generated by the local regulator 300 to the memory cells 360a-n when activated. A gate of the first transistor is connected to and controlled by a switch control line. The switch control line is also connected to an inverter 370. The inverter 370 inverts a signal provided on the switch control line to a gate of the second transistor 350.

Accordingly, the switch control line provides a control signal from, for example, the switch logic 120 of FIG. 1 to control which of the first transistor 340 and the second transistor 350 are active. The inverter 370 ensures that only one of the two transistors 340 and 350 are active by providing an inverted control signal to the second transistor 350. Thus, when the control signal is high the first transistor 340 is inactive but the inverter 370 provides a low signal to the second transistor 350 to activate the second transistor 350. Similarly, when the control signal is low the first transistor 340 is active while the inverter 370 provides a high signal to the second transistor 350 making the second transistor 350 inactive. It should be noted that while the transistors 330, 340 and 350 are shown as pmos, in other embodiments nmos may be substituted and thus the control signal would activate the local voltage versus the Vdd in an opposite manner. In either case, either the local voltage or the source voltage (Vdd) is dynamically provided to the memory cells 360*a-n* of a particular memory sub-array.

In general, each separate memory sub-array (e.g., sub-arrays 150*a-n* of FIG. 1) includes a local regulator and switch similar to the local regulator 300 and the switch 310. In this way, power to a given sub-array can be controlled independently of other sub-arrays according to, for example, memory request address information.

Figure 4:
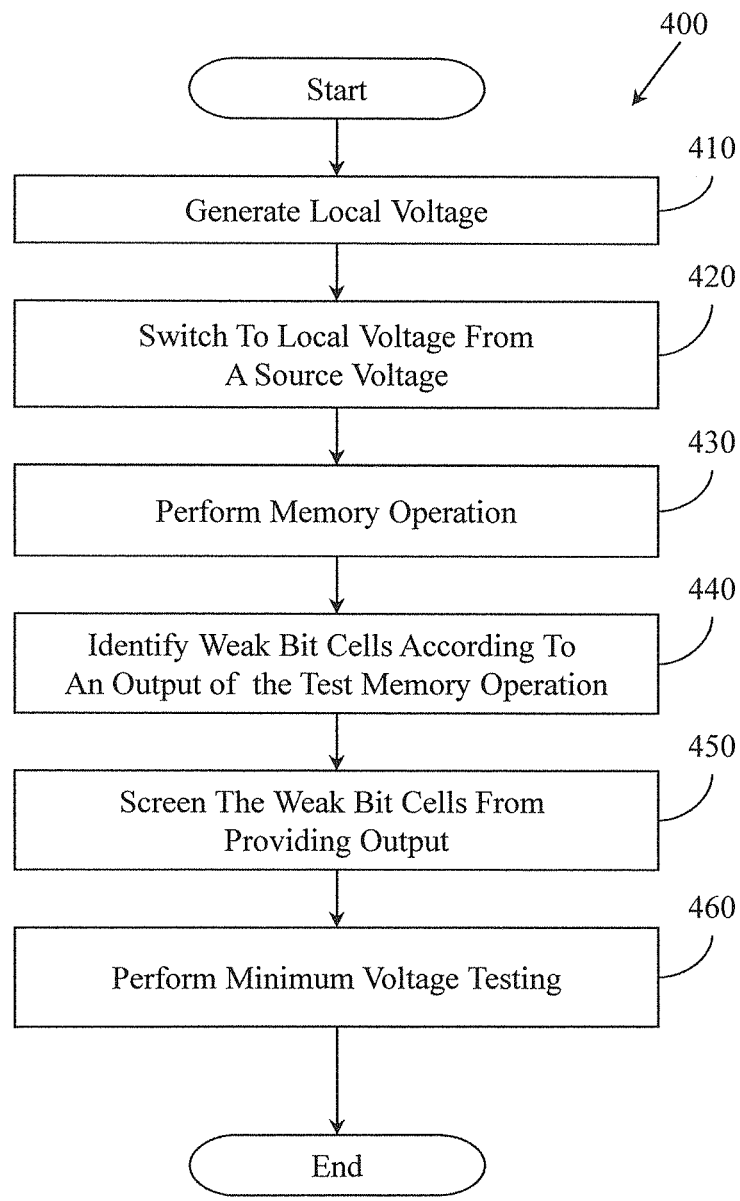
FIG. 4 illustrates an embodiment of a method associated with powering a memory sub-array by selecting between voltage sources.

Further aspects of selecting between the local voltage and the source voltage (Vdd) will be discussed in relation to FIG. 4. FIG. 4 illustrates a method 400 associated with using a local voltage and a source voltage to test memory cells. Method 400 will be discussed in relation to the memory device 100 of FIG. 1. Of course, it should be appreciated that method 400 is not limited to operating within the memory device 100 but is discussed in relation to the memory device 100 for purposes of explanation.

At 410, a local voltage is generated. In one embodiment, the local voltage is generated according to a reference voltage. For example, as shown in FIG. 1, the reference voltage generator 110 produces a reference voltage depending on a value of a test register or other mechanism that controls what voltage level the reference voltage generator 110 produces the reference voltage.

The reference voltage is provided to each of the local regulators 170*a-n* to control a voltage level of the local voltage generated by the local regulators 170*a-n*. In general, the local regulators 170*a-n* are controlled together as a group to produce the same local voltages. Thus, the local regulators 170*a-n* generally provide substantially similar voltages as the local voltage. However, it should be noted that while the local regulators 170*a-n* generate substantially similar voltages as a function of the reference voltage, the source voltage is independent of the local voltage and generally remains unchanged.

At 420, a voltage for powering a memory sub-array is switched from the source voltage (e.g., Vdd) to the local voltage. A time when the local voltage powers the memory sub-array (e.g., memory sub-arrays 150*a-n*) is controlled by the switch logic 120. That is, the switch logic 120 dynamically controls a switch in each of the memory sub-arrays 150*a-n* to select between the source voltage and the local voltage.

In one embodiment, the switch logic 120 controls whether the local voltage or the source voltage powers the memory sub-arrays 150*a-n* according to a signal from the test logic 130. In another embodiment, the switch logic 120 receives input from a hardware processor or other device to switch between the two voltage sources. Thus, whether the primary source voltage (Vdd) or the local voltage is powering the memory sub-arrays 150*a-n* is dynamically selectable. In this way, particular memory operations of the memory cells 160*a-n* can be isolated to be performed using a particular voltage.

The switch logic 120 may also independently control which power source is selected for each separate memory sub-array 150*a-n*. Thus, a power source for each of the memory sub-arrays 150*a-n* can be controlled independently, for example, according to current or predicted memory requests, a particular sub-array selected for testing, and so on.

At 430, a memory operation is performed. In one embodiment, the memory operation is a test memory operation. The test memory operation may include a write operation, a storage/retention operation, and/or a read operation. In general, each different test memory operation includes, for example, performing other operations at the source voltage and performing the test memory operation at the local voltage. Each separate test memory operation will now be addressed individually.

Write Operation

To test a write operation, at 430, test data is written into memory cells of a memory sub-array being tested while the memory sub-array is powered at the local voltage. In one embodiment, the local voltage is successively reduced at iteration of testing the memory operation. That is, for each iteration of blocks 410-440 a different lower voltage may be selected at 410 for each successive iteration.

However, it should be appreciated that, in general, the local voltage is a reduced voltage level in comparison to the source voltage (Vdd). Thus, performing the test operation occurs with a reduced voltage level for powering the sub-array. In this way, memory cells with defective/weak components associated with the particular test operation can be identified. As discussed previously, a "weak" memory cell is a cell with defective components that cause a failure at lower voltages. The memory cell is "weak" in comparison to other memory cells that function correctly at the same lower voltage.

For example, during testing of a write operation, the test data is written into the memory cells with the memory cells being powered at a lower voltage level of the local voltage. In one embodiment, the test logic 130 automatically writes the test data into the memory cells using memory built-in self-testing (MBIST) components. In general, the MBIST components provide test input at a native clock speed of the memory without intervention from a host processor or other device.

After the write operation completes, the switch logic 120, for example, immediately switches a power source back to the source voltage. Dynamically switching the power source permits the low voltage testing to be directed at the particular memory operation and avoids errors being generated from other operations within the memory cells.

Accordingly, with the power source switched to the source voltage (Vdd) the test data is retained in the memory cells for a short duration to test memory cell retention and is then read from the memory cells to produce output data from the test, which is then used at 440 to identify weak bit cells. In this way, the write operation is isolated from other memory operations and can be tested under low voltage levels.

Retention Testing

To test retention at 430, test data is written into the memory cells prior to block 420. Accordingly, the test data is written into the memory cells while the source voltage is powering the memory cells. Subsequently, at 420, the voltage level is reduced to the local voltage so that retention of the test data within the memory cells can be tested at 430 by supplying the memory cells with the lower voltage level of the local voltage for a predefined period of time.

Thereafter, the switch logic 120 changes a voltage of the memory cells back to the source voltage so that the test data can be read from the memory cells to produce an output.

Read Testing

To test a read operation of the memory cells, prior to 430 test data is written into the memory cells and stored with the memory sub-array powered using the source voltage. Subsequently, at 420, the voltage is switched to the local voltage from the source voltage and test data is read out from the memory cells to produce the output while the memory is powered using the local voltage. In this way, the read operation can be isolated from other memory operations and tested under lower voltages.

At 440, weak bit cells are identified according to the output produced from a particular test. In one embodiment, the test input data is compared with the produced output data by, for example, the test logic 130. Weak bit cells are identified from mismatches between the test input data and the test output data. In general, mismatches indicate where cells have flopped/changed a value due to weak performance under the lower voltage level of the local voltage.

At 450, memory cells identified as weak bit cells from block 440 are screened from further use. In one embodiment, the weak bit cells are prevented from being used by screening out the bit cells or masking the weak bit cells from receiving data. In another embodiment, the weak bit cells are repaired using a redundant column of bit cells that are used in place of the weak bit cells. In this way, cells that perform poorly can be identified and screened from causing further difficulties.

Additionally, while identifying the weak bit cells may facilitate repairs to the memory, information about the identified weak bit cells can also provide useful insights about die-to-die process variation during manufacture and can be used for future revisions of a design for the memory cells.

At 460, additional minimum voltage testing is performed while screening out the weak bit cells identified at 440. In one embodiment, the minimum voltage testing includes iteratively reading data into the memory cells and from the cells. Test input are compared to outputs as discussed at block 440 to identify memory cell failures. Furthermore, the memory cells are powered with a source voltage that is progressively lowered with each successive iteration by the hardware processor or another device that controls the source voltage. Note that the source voltage is progressively lowered and used to power the whole memory device 100 with the weak bit cells screened out for minimum voltage testing.

Accordingly, the memory can be iteratively tested with successively lower source voltages until identifying a voltage at which a threshold number of memory cells fail (e.g., 5% failure). Consequently, a minimum voltage threshold for functioning can be determined for a memory device. In general, the minimum voltage threshold is a lower bound voltage level for powering the memory device 100 at which the device can function.

In one embodiment, the minimum voltage threshold determined from 460 is used to set a voltage level of a power save mode for the memory device 100. For example, after method 400 completes and during functional operation of the memory device 100 (i.e., while reading and writing data), the reference voltage generator 110 is configured to cause the local regulators 170*a-n* to generate local voltages that are a function of the minimum voltage threshold determined at 460. Thus, the local voltages may be set at a level that is a predefined margin (e.g., 5%) above the minimum voltage threshold to ensure functionality of the memory device 100 at the selected local voltage.

Thereafter, the switch logic 120, for example, individually switches power to the local voltage within the memory sub-arrays 150*a-n* to save power when a respective memory sub-array is not actively reading or writing data. For example, the switch logic 120 uses memory address and pipeline information for queued commands to selectively power the individual memory sub-arrays 150*a-n* using the local voltage. That is, when a sub-array is not being accessed, predicted to be accessed, or is not queued to be accessed, the switch logic 120 switches power from the source voltage (Vdd) to the local voltage. In this way, the local regulators 170*a-n* provide for permitting a power saving scheme locally at each sub-array without changing the source voltage (vdd).

Definitions and Other Embodiments

In another embodiment, the described methods and/or their equivalents may be implemented with computer executable instructions. Thus, in one embodiment, a non-transitory computer storage medium is configured with stored computer executable instructions that when executed by a machine (e.g., processor, computer, and so on) cause the machine (and/or associated components) to perform the method.

While for purposes of simplicity of explanation, the illustrated methodologies in the figures are shown and described as a series of blocks, it is to be appreciated that the methodologies are not limited by the order of the blocks, as some blocks can occur in different orders and/or concurrently with other blocks from that shown and described. Moreover, less than all the illustrated blocks may be used to implement an example methodology. Blocks may be combined or separated into multiple components. Furthermore, additional and/or alternative methodologies can employ additional actions that are not illustrated in blocks. The methods described herein are limited to statutory subject matter under 35 U.S.C §101.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium," as used herein, refers to a non-transitory medium that stores instructions and/or data configured to perform one or more of the disclosed functions when executed. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an application specific integrated circuit (ASIC), a programmable logic device, a compact disk (CD), other optical medium, a random access memory (RAM), a read only memory (ROM), a memory chip or card, a memory stick, and other media from which a computer, a processor or other electronic device can function with. Each type of media, if selected for implementation in one embodiment, includes stored instructions of an algorithm configured to perform one or more of the disclosed and/or claimed functions.

"Logic", as used herein, includes a component that is implemented in computer or electrical hardware, firmware, a non-transitory medium with stored instructions of an executable algorithm/application, a module stored in a non-transitory memory and/or combinations of these to perform any of the functions or actions as disclosed herein, and/or to cause a function or action from another logic, method, and/or system to be performed as disclosed herein. Logic may include a microprocessor programmed with an algorithm, a discrete logic (e.g., ASIC), at least one circuit, an analog circuit, a digital circuit, a programmed logic device, a memory device containing instructions of an algorithm, and so on, all of which are configured to perform one or more of the disclosed functions. Logic may include one or more gates, combinations of gates, or other circuit components configured to perform one or more of the disclosed functions. Where multiple logics are described, it may be possible to incorporate the multiple logics into one logic. Similarly, where a single logic is described, it may be possible to distribute that single logic between multiple logics. In one embodiment, one or more of these logics are corresponding structure associated with performing the disclosed and/or claimed functions. Choice of which type of logic to implement may be based on desired system conditions or specifications. Logic is limited to statutory subject matter under 35 U.S.C. §101.

An "operable connection," or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, non-transitory computer-readable medium). Logical and/or physical communication channels can be used to create an operable connection.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the disclosure is not limited to the specific details, the representative apparatus, and illustrative examples shown and described. Thus, this disclosure is intended to embrace alterations, modifications, and variations that fall within the scope of the appended claims, which satisfy the statutory subject matter requirements of 35 U.S.C. §101.

To the extent that the term "includes" or "including" is employed in the detailed description or the claims, it is intended to be inclusive in a manner similar to the term "comprising" as that term is interpreted when employed as a transitional word in a claim.

What is claimed is:

1. A memory device, comprising:
  a memory sub-array including a set of memory cells and a local voltage regulator, wherein the local voltage regulator is configured to generate a local voltage for powering the memory sub-array;
  a reference voltage generator connected to the local voltage regulator, wherein the reference voltage generator is configured to generate different reference voltages that, when received by the local voltage regulator, cause the local voltage regulator to generate different local voltage values;
  switch logic connected to the memory sub-array and configured to select between the local voltage and a source voltage to power the memory sub-array, wherein the source voltage is provided to the memory device by a host device; and
  test logic configured to iteratively test the memory sub-array using a test memory operation while powering the memory sub-array with a series of lessening voltages corresponding to the different local voltage values produced by the local voltage regulator as a result of receiving the plurality of different reference voltages, and wherein the test logic is configured to identify a minimum voltage at which the memory sub-array is operable from iteratively testing the memory sub-array.

2. The memory device of claim 1, wherein the memory device includes a plurality of the memory sub-arrays, and wherein each of the plurality of the memory sub-arrays includes a local voltage generator.

3. The memory device of claim 1, wherein the test logic is configured to separately test read operations and write operations for memory cells of the memory sub-array by controlling the switch logic to select the local voltage during a read operation or a write operation according to which operation is being tested.

4. The memory device of claim 3, wherein the test logic is configured to identify which memory cells fail a test by comparing a test input with a test output, and wherein the test logic is configured to identify whether a failure is from a read operation or a write operation by determining whether the test output is from a read test or a write test.

5. The memory device of claim 3, wherein the test logic is configured to screen-out identified weak memory cells from subsequent minimum voltage testing.

6. The memory device of claim 1, wherein the memory device is a static random access memory (SRAM) that includes fin-based field effect transistors (FinFETs), and wherein the memory device is an embedded L3 cache of a hardware processor.

7. An apparatus, comprising:
switch logic configured to control a switch to select between a source voltage and a local voltage as a power source for a memory sub-array, wherein the switch logic is configured to control the switch according to a memory operation being tested;
a local voltage regulator in the memory sub-array that generates the local voltage;
a reference voltage generator connected to the local voltage regulator, wherein the reference voltage generator is configured to generate different reference voltages that, when received by the local voltage regulator, cause the local voltage regulator to generate different local voltage values;
test logic configured to control the memory sub-array to iteratively perform the test memory operation with the local voltage powering the memory sub-array, wherein the different local voltage values are different from the source voltage.

8. The apparatus of claim 7, wherein the test logic is configured to identify memory cells in the memory sub-array with failures for the test memory operation by comparing a test input used with the test memory operation with an output from the test memory operation.

9. The apparatus of claim 8, wherein memory cells with failures are memory cells with defects that prevent proper operation at the local voltage.

10. The apparatus of claim 7, wherein the test logic is configured to separately test read operations and write operations for memory cells of the memory sub-array by controlling the switch logic to select the local voltage during a read operation or a write operation according to which operation is being tested.

11. The apparatus of claim 10, wherein the test logic is configured to prevent memory cells identified as failing the test memory operation from subsequent testing by screening failed memory cells from further use.

12. The apparatus of claim 7, wherein the test logic is configured to iteratively test the memory sub-array using the test memory operation while powering the memory sub-array with a series of lessening local voltages produced by the local voltage regulator that correspond to the different local voltage values to identify memory cell failures.

13. The apparatus of claim 7, wherein the memory sub-array is a static random access memory (SRAM) that includes fin-based field effect transistors (FinFETs), and wherein the apparatus is an SRAM device that is part of an L3 cache of a microprocessor.

14. A method, the method comprising:
switching from a source voltage to a local voltage for powering a memory sub-array, wherein the source voltage is provided by a host device to the memory sub-array and the local voltage is generated at the memory sub-array based on a first reference voltage received at the memory sub-array of a plurality of different reference voltages;
performing a test memory operation while the memory sub-array is powered using the local voltage, wherein performing the test memory operation uses a test input to the memory sub-array and produces an output that isolates the test memory operation being performed while the memory sub-array is powered using the local voltage;
comparing the test input with the output to identify memory cells in the memory sub-array that produce an error for the test memory operation, wherein comparing the test input with the output identifies which memory cells in the memory sub-array fail to operate with the memory sub-array powered using the local voltage; and
iteratively lowering the local voltage while performing the test memory operation for each separate voltage level of the local voltage corresponding to the plurality of different reference voltages until detecting a threshold number of the memory cells have failed.

15. The method of claim 14, further comprising:
switching to the source voltage after performing the test memory operation when the test memory operation is a write operation; and
reading the test input from the memory cells while the memory sub-array is powered using the source voltage.

16. The method of claim 14, further comprising:
when the test memory operation is a read operation, writing the test input to the memory cells while powering the memory sub-array using the source voltage and prior to performing the test memory operation.

17. The method of claim 14, further comprising:
testing memory cell retention by selecting the local voltage to power the memory sub-array except for when a read operation or write operation is being performed.

* * * * *